United States Patent
Lee et al.

(10) Patent No.: US 11,015,089 B2
(45) Date of Patent: May 25, 2021

(54) POLYIMIDE FILM FOR SEMICONDUCTOR PACKAGE REFLOW PROCESS, AND MANUFACTURING METHOD THEREFOR

(71) Applicant: IPI TECH INC., Daejeon (KR)

(72) Inventors: Kye-Ung Lee, Daejeon (KR); Ho-Young Park, Daejeon (KR); Tae-Seok Lee, Daejeon (KR)

(73) Assignee: IPI TECH INC., Daejeon (KR)

(*) Notice: Subject to any disclaimer, the term of this patent is extended or adjusted under 35 U.S.C. 154(b) by 100 days.

(21) Appl. No.: 16/329,394

(22) PCT Filed: Jun. 29, 2017

(86) PCT No.: PCT/KR2017/006871
§ 371 (c)(1),
(2) Date: Feb. 28, 2019

(87) PCT Pub. No.: WO2018/043897
PCT Pub. Date: Mar. 8, 2018

(65) Prior Publication Data
US 2019/0194496 A1    Jun. 27, 2019

(30) Foreign Application Priority Data
Aug. 30, 2016  (KR) .................. 10-2016-0110930

(51) Int. Cl.
| | | |
|---|---|---|
| C09J 7/29 | (2018.01) | |
| H01L 21/683 | (2006.01) | |
| H01L 21/02 | (2006.01) | |
| H01L 21/48 | (2006.01) | |
| H01L 23/498 | (2006.01) | |
| H01L 23/488 | (2006.01) | |
| B32B 7/12 | (2006.01) | |
| B32B 27/08 | (2006.01) | |
| B32B 27/28 | (2006.01) | |
| H01L 23/00 | (2006.01) | |
| H01L 21/56 | (2006.01) | |

(52) U.S. Cl.
CPC .................... C09J 7/29 (2018.01); B32B 7/12 (2013.01); B32B 27/08 (2013.01); B32B 27/281 (2013.01); H01L 21/02 (2013.01); H01L 21/48 (2013.01); H01L 21/6836 (2013.01); H01L 23/488 (2013.01); H01L 23/498 (2013.01); H01L 24/50 (2013.01); *C09J 2203/326* (2013.01); *C09J 2301/122* (2020.08); *C09J 2301/162* (2020.08); *C09J 2479/086* (2013.01); *H01L 21/563* (2013.01); *H01L 2221/6834* (2013.01); *H01L 2221/68377* (2013.01); *H01L 2924/07025* (2013.01); *Y10T 428/28* (2015.01); *Y10T 428/2848* (2015.01)

(58) Field of Classification Search
None
See application file for complete search history.

(56) References Cited

U.S. PATENT DOCUMENTS

| | | | | |
|---|---|---|---|---|
| 3,361,589 | A * | 1/1968 | Lindsey ................. | B32B 27/00 428/473.5 |
| 2005/0272608 | A1* | 12/2005 | Yokozawa ............. | G11B 5/484 505/100 |
| 2006/0191632 | A1* | 8/2006 | Usuki ..................... | B32B 15/08 156/331.1 |
| 2007/0044910 | A1* | 3/2007 | Kuo ....................... | B32B 27/281 156/307.3 |
| 2010/0297455 | A1* | 11/2010 | Wu ....................... | C09D 183/08 428/447 |

FOREIGN PATENT DOCUMENTS

| | | |
|---|---|---|
| JP | 09-001723 A | 1/1997 |
| JP | 2002-190502 A | 7/2002 |
| JP | 2010-238852 A | 10/2010 |
| JP | 2012-036401 A | 2/2012 |
| JP | 2013110402 A | 6/2013 |
| JP | 2016143741 A | 8/2016 |
| KR | 10-2013-0003137 A | 1/2013 |
| KR | 10-2014-0084095 A | 7/2014 |
| WO | 2016133114 A1 | 8/2016 |

OTHER PUBLICATIONS

Lee Tae Seok et al., "Method For Forming Coating Layers of Thermoplastic Polyimde", machine translation of KR101565324B1, Nov. 3, 2015 (Year: 2015).*

Information sheet for aromatic diamine "[1,1'-Biphenyl]-4,4'-diamine,3,3'-dimethyl-", NIST Chemistry Webbook, SRD 69, retrieved Oct. 23, 2020 (Year: 2020).*

Hase, Naoki et al., machine translation of JP09-001723 A, Jan. 7, 1997 (Year: 1997).*

Soo-Jin Park et al., Influence of Surface Treatment of Polyimide Film on Adhesion Enhancement between Polyimide and Metal Films, Bulletin of the Korean Chemical Society, 2007, pp. 188-192, vol. 28, No. 2.

International Search Report for PCT/KR2017/006871 dated Oct. 20, 2017, citing the above reference(s).

Japanese Office Action dated Jun. 2, 2020, in connection with the Japanese Patent Application No. 2019-532901 citing the above reference(s).

* cited by examiner

Primary Examiner — Anish P Desai
(74) Attorney, Agent, or Firm — Hauptman Ham, LLP

(57) ABSTRACT

Disclosed are a polyimide film for a semiconductor package reflow process, and a manufacturing method therefor, the polyimide film being capable of ensuring ease of attachment/detachment of a semiconductor chip after a reflow process is completed, by means of the application of a thermoplastic polyimide layer having a glass transition temperature less than or equal to a reflow process temperature.

9 Claims, 1 Drawing Sheet

POLYIMIDE FILM FOR SEMICONDUCTOR PACKAGE REFLOW PROCESS, AND MANUFACTURING METHOD THEREFOR

CROSS REFERENCE TO RELATED APPLICATION

This present application is a national stage filing under 35 U.S.C § 371 of PCT application number PCT/KR2017/006871 filed on Jun. 29, 2017 which is based upon and claims the benefit of priority to Korean Patent Application No. 10-2016-0110930 filed on Aug. 30, 2016 in the Korean Intellectual Property Office. The disclosures of the above-listed applications are hereby incorporated by reference herein in their entirety.

TECHNICAL FIELD

The present invention relates to a polyimide film and a manufacturing method therefor and more specifically, to a polyimide film for a semiconductor package reflow process, and a manufacturing method therefor to which a thermoplastic polyimide layer having glass transition temperature lower than or equal to reflow temperature is applied such that a semiconductor chip is easily attached and detached after reflow.

BACKGROUND ART

Polyimide films have excellent dimensional, mechanical, thermal and chemical stabilities. Thus, they have been widely used in the electricity sector, the electronic material sector, the space sector, the aviation sector and the telecommunication sector. Such polyimide films are usually used as a material for a flexible printed circuit board having fine patterns, for instance, a base film in the process of tape automated bonding (TAB) or in the technology of chip on film (COF), and the like because theirs parts become short, small and less heavy.

TAB or COF is used to seal integrated circuit (IC) chips or large-scale integrated (LSI) chips. Specifically, in the technology of TAB or COF, conductive patterns are made on flexible tapes, and chips are placed onto the flexible tapes and sealed.

Thus, products can become short, small and less heavy because the sizes of packaged sealing elements are small in size and have flexibility.

Polyamide films are required to have excellent dimensional stability so as to be used as a base film for TAB or COF.

When a semiconductor package is manufactured, reflow soldering is necessarily performed so as to electrically connect a semiconductor chip to a substrate. During reflow soldering, a polyimide film is exposed approximately at 260° C.

A conventional polyimide film has a structure where a thermoplastic polyimide layer and an adhesive layer are consecutively piled onto a base film. In general, a thermoplastic polyimide layer having glass transition temperature of about 300° C. or higher, which is higher than reflow temperature, is interposed between a base film and an adhesive layer, in terms of such a conventional polyimide film. However, such conventional polyimide films are not easily attached to and detached from semiconductor chips after reflow.

As a related art document, Korean Patent Laid-Open Publication No. 10-2014-0084095 (published on Jul. 4, 2014) is disclosed. A reflow film, a method for forming a solder bump, a method for forming a solder joint and a semiconductor device are described in the document.

DISCLOSURE

Technical Problems

The present invention provides a polyimide film and a manufacturing method therefor to which a thermoplastic polyimide layer having glass transition temperature lower than or equal to reflow temperature is applied such that a semiconductor chip is easily attached and detached after a reflow process is completed.

Technical Solutions

As a means to achieve the above-described purposes, a polyimide film for a semiconductor package reflow process includes a non-thermoplastic polyimide layer; a thermoplastic polyimide layer piled onto the non-thermoplastic polyimide layer and having glass transition temperature lower than or equal to reflow temperature; and an adhesive layer attached onto the thermoplastic polyimide layer, wherein a surface of the thermoplastic polyimide layer is modified with a carboxyl group.

As a means to achieve the above-described purposes, a manufacturing method for a polyimide film for a semiconductor package reflow process according to an embodiment of the present invention, includes (a) preparing a non-thermoplastic polyimide layer; (b) attaching, onto the non-thermoplastic polyimide layer, a thermoplastic polyimide layer which has glass transition temperature lower than or equal to reflow temperature and the surface of which is modified with a carboxyl group; and (c) attaching an adhesive layer onto the thermoplastic polyimide layer.

Advantageous Effects

In relation to a polyimide film for a semiconductor package reflow process and a manufacturing method therefor according to the present invention, an aromatic diamine containing any one of an ether group, a ketone group and a methyl group and an aromatic dianhydride containing any one of an ether group, a ketone group and a methyl group are synthesized in an organic solvent so as to produce a polyamic acid, and the polyamic acid is used for a thermoplastic polyimide layer. Accordingly, the thermoplastic polyimide layer may have glass transition temperature of 260° C. or lower.

That is, in relation to a polyimide film for a semiconductor package reflow process and a manufacturing method therefor according to the present invention, the thermoplastic polyimide layer having glass transition temperature of 260° C. or lower is applied to a polyimide film such that the releasing property of the polyimide film is ensured after reflow, thereby enabling the polyimide film to be easily attached to and detached from a semiconductor chip.

Additionally, in relation to a polyimide film for a semiconductor package reflow process and a manufacturing method therefor according to the present invention, a thermoplastic polyimide layer the surface of which is modified with a carboxyl group is applied to a polyimide film such that the adhesive force between the thermoplastic polyimide layer and an adhesive layer is significantly increased.

BEST MODE

Figure 1:
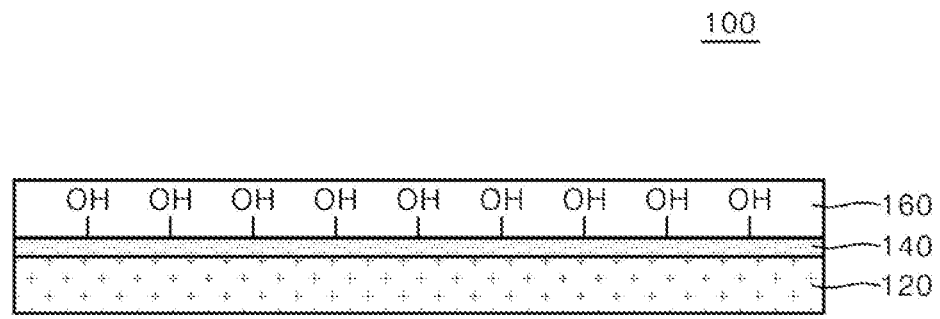
FIG. 1 is a sectional view showing a polyimide film for a semiconductor package reflow process according to an embodiment of the present invention.

Hereinafter, embodiments of the present invention will be described in detail with reference to the attached drawings. However, the present invention may be implemented in many different forms and is not limited to the embodiments described herein. Further, the embodiments are provided so as to make the present invention through and complete and to thoroughly convey the scope of the present invention to one having ordinary skill in the art to which the present invention pertains. The present invention should be defined only according to the appended claims. Throughout the specification, like reference numerals denote like elements.

A polyimide film for a semiconductor package reflow process and a manufacturing method therefor according to preferred embodiments of the present invention are specifically described with reference to the attached drawings as follows.

FIG. 1 is a sectional view showing a polyimide film for a semiconductor package reflow process according to an embodiment of the present invention.

With reference to FIG. 1, a polyimide film for a semiconductor package reflow process 100 according to an embodiment of the present invention includes a non-thermoplastic polyimide layer 120, a thermoplastic polyimide layer 140 and an adhesive layer 160.

The non-thermoplastic polyimide layer 120 is arranged at a lowest portion of the polyimide film 100. In this case, the non-thermoplastic polyimide layer 120 is used so that the polyimide film can withstand temperature of about 260° C. or higher, which is temperature in a semiconductor reflow process. The non-thermoplastic polyimide layer may be a thermosetting polyimide but is not limited to this.

The thermoplastic polyimide layer 140 is piled onto the non-thermoplastic polyimide layer 120 and has glass transition temperature lower than or equal to reflow temperature. In this case, a surface of the thermoplastic polyimide layer 140 is modified with a carboxyl group.

The thermoplastic polyimide layer 140 preferably has glass transition temperature lower than or equal to reflow temperature and more preferably, has glass transition temperature lower than or equal to 260° C.

When the thermoplastic polyimide layer 140 has glass transition temperature lower than or equal to 260° C. as described above, the thermoplastic polyimide layer 140 is melted in a reflow process and has flexibility like rubber such that the adhesive force of the thermoplastic polyimide layer increases and the thermoplastic polyimide layer is firmly attached onto the adhesive layer 160. After the reflow process, the thermoplastic polyimide layer is hardened. Thus, the releasing property of the thermoplastic polyimide layer improves such that the thermoplastic polyimide layer is readily attached to and detached from a semiconductor chip (invisible).

To this end, a polyamic acid, prepared by means of a synthesis of an aromatic diamine containing any one of an ether group, a ketone group and a methyl group and an aromatic dianhydride containing any one of an ether group, a ketone group and a methyl group in an organic solvent, is preferably used for the thermoplastic polyimide layer.

In this case, the aromatic diamine contains 3,3'-dimethyl-[1,1'-biphenyl]-4,4'-diamine expressed as chemical formula 1.

[Chemical formula 1]

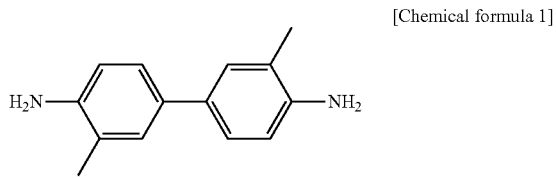 [SMILES: Cc1cc(-c2ccc(N)c(C)c2)ccc1N]

Additionally, the aromatic dianhydride contains 3,3',4,4'-benzophenonetetracarboxylic dianhydride expressed as chemical formula 2.

[Chemical formula 2]

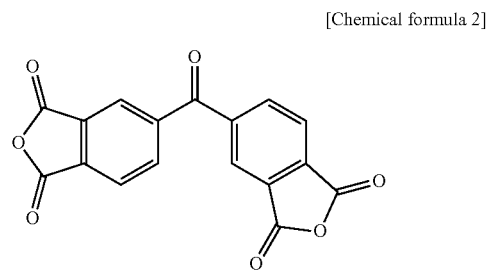 [SMILES: O=C(c1ccc2c(c1)C(=O)OC2=O)c1ccc2c(c1)C(=O)OC2=O]

Additionally, one or more selected from N-Methyl-2-pyrrolidone (NMP), toluene, dimethyl sulfoxide (DMSO), ethyl lactate (EL), and the like may be used as the organic solvent. However, the organic solvent is not limited to what has been described.

Further, according to the present invention, a polyamic acid is used for the thermoplastic polyimide layer 140, and the polyamic acid is prepared by means of a synthesis of an aromatic diamine containing any one of an ether group, a ketone group and a methyl group and an aromatic dianhydride containing any one of an ether group, a ketone group and a methyl group in an organic solvent. As a result, the thermoplastic polyimide layer 140 may have glass transition temperature of 260° C. or lower.

Additionally, when the thermoplastic polyimide layer 140 the surface of which is modified with a carboxyl group is used as in the present invention, the adhesive force between the thermoplastic polyimide layer 140 and the adhesive layer 160 is increased by the carboxyl group.

When a small amount of KOH is added to a polyamic acid and then is heated at temperatures from 300 to 400° C., the surface of the thermoplastic polyimide layer 140 is modified with a carboxyl group as in chemical equation 1. To put it another way, while a polyamic acid is heated at temperatures from 300 to 400° C., imidization occurs. As a result, polyimide is produced from the polyamic acid by means of imidization.

[Chemical equation 1]

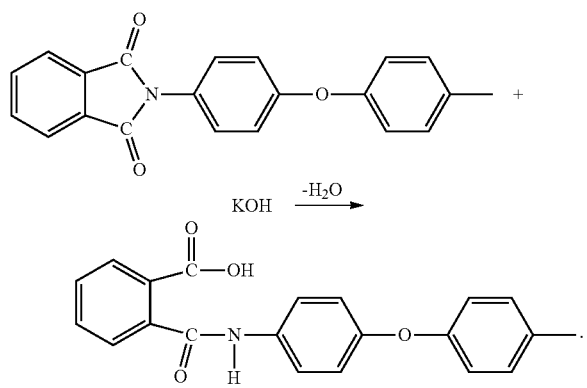

In this case, 0.5 to 3 parts by weight of KOH is added with respect to 100 parts by weight of a polyamic acid. When less than 0.5 parts by weight of KOH is added with respect to 100 parts by weight of a polyamic acid, it may be difficult to modify the surface of thermoplastic polyimide layer. Conversely, when more than 3 parts by weight of KOH is added with respect to 100 parts by weight of a polyamic acid, the imide structure of the polyamic acid or the polyimide is broken down. Thus, physical and chemical properties of the polyimide are undermined.

The adhesive layer 160 is attached onto the thermoplastic polyimide layer 140. A variety of adhesives such as an acrylic adhesive, a rubber adhesive, a silicone adhesive, polyvinyl ether, and the like may be used as an adhesive layer 160.

Considering the adhesive property of an adhesive applied to a semiconductor chip and the extent to which the adhesive is washed after being separated from the semiconductor chip, an (metha) acrylic adhesive, in which an (metha) acrylic polymer is used as a base polymer, is preferable.

In terms of a polyimide film for a semiconductor package reflow process according to the above-described embodiment, a polyamic acid is used for a thermoplastic polyimide layer, and the polyamic acid is prepared by means of a synthesis of an aromatic diamine containing any one of an ether group, a ketone group and a methyl group and an aromatic dianhydride containing any one of an ether group, a ketone group and a methyl group in an organic solvent. Thus, the thermoplastic polyimide layer may have glass transition temperature of 260° C. or lower.

That is, the thermoplastic polyimide layer having glass transition temperature of 260° C. or lower is applied to a polyimide film for a semiconductor package reflow process according to the embodiment such that the releasing property of the polyimide film is ensured after reflow, thereby enabling the polyimide film to be easily attached to and detached from a semiconductor chip.

Further, the thermoplastic polyimide layer the surface of which is modified with a carboxyl group is applied to the polyimide film for a semiconductor package reflow process according to the embodiment such that the adhesive force between the thermoplastic polyimide layer and an adhesive layer is significantly increased.

With reference to the attached drawings, a manufacturing method for a polyimide film for a semiconductor package reflow process according to an embodiment of the present invention is described hereunder.

Figure 2:
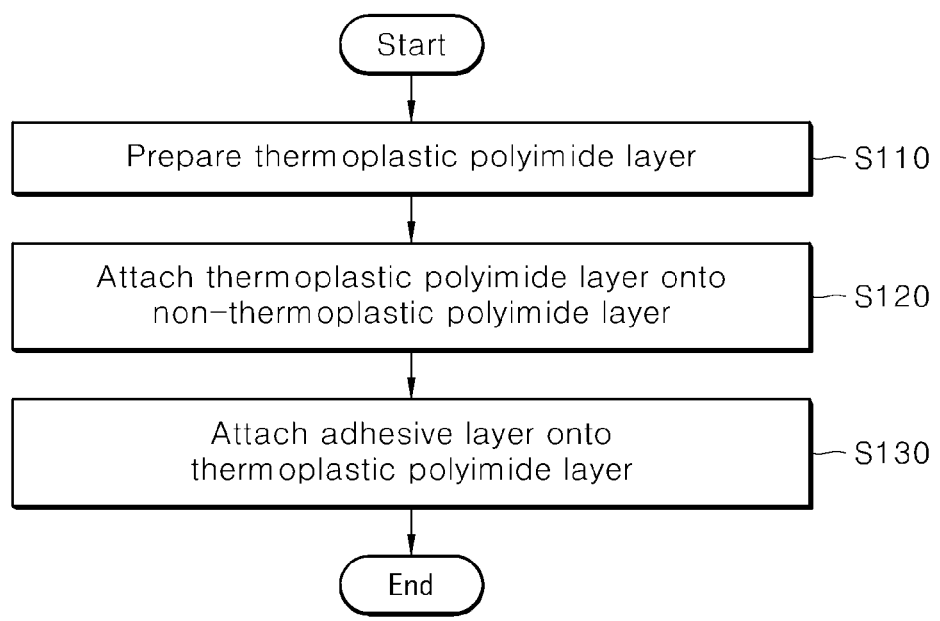
FIG. 2 is a flow chart of a manufacturing method for a polyimide film for a semiconductor package reflow process according to an embodiment of the present invention.

FIG. 2 is a flow chart of a manufacturing method for a polyimide film for a semiconductor package reflow process according to an embodiment of the present invention.

With reference to FIG. 2, a manufacturing method for a polyimide film for a semiconductor package reflow process according to an embodiment of the present invention includes preparing a non-thermoplastic polyimide layer (S110), attaching a thermoplastic polyimide layer onto the non-thermoplastic polyimide layer (S120) and attaching an adhesive layer onto the thermoplastic polyimide layer (S130).

Preparing a Non-Thermoplastic Polyimide Layer

In step 110, a non-thermoplastic polyimide layer is prepared. The non-thermoplastic polyimide layer is arranged at a lowest portion of the polyimide film. In this case, the non-thermoplastic polyimide layer is used so that the polyimide film can withstand a temperature of approximately 260° C. or higher, which is a temperature in a semiconductor reflow process. The non-thermoplastic polyimide layer may be a thermosetting polyimide but is not limited to this.

Attaching a Thermoplastic Polyimide Layer onto the Non-Thermoplastic Polyimide Layer In step 120, a thermoplastic polyimide layer, which has glass transition temperature lower than or equal to reflow temperature and the surface of which is modified with a carboxyl group, is attached onto the non-thermoplastic polyimide layer.

In this case, the thermoplastic polyimide layer 140 preferably has glass transition temperature lower than or equal to reflow temperature and more preferably, has glass transition temperature lower than or equal to 260° C.

When the thermoplastic polyimide layer has glass transition temperature of 260° C. or lower as described above, the thermoplastic polyimide layer 140 is melted during reflow and has flexibility like rubber such that the adhesive force of the thermoplastic polyimide layer increases and the thermoplastic polyimide layer is firmly attached onto the adhesive layer. After the reflow process, the thermoplastic polyimide layer is hardened. Thus, the release property of the thermoplastic polyimide layer improves such that the thermoplastic polyimide layer is readily attached to and detached from a semiconductor chip.

To this end, a polyamic acid, prepared by means of a synthesis of an aromatic diamine containing any one of an ether group, a ketone group and a methyl group and an aromatic dianhydride containing any one of an ether group, a ketone group and a methyl group in an organic solvent, is preferably used for the thermoplastic polyimide layer.

In this case, the aromatic diamine contains 3,3'-dimethyl-[1,1'-biphenyl]-4,4'-diamine.

Additionally, the aromatic dianhydride contains 3,3',4,4'-benzophenonetetracarboxylic dianhydride.

Additionally, one or more selected from N-Methyl-2-pyrrolidone (NMP), toluene, dimethyl sulfoxide (DMSO), ethyl lactate (EL), and the like may be used as the organic solvent. However, the organic solvent is not limited to what has been described.

Further, when the thermoplastic polyimide layer the surface of which is modified with a carboxyl group is used as in the present invention, the adhesive force between the thermoplastic polyimide layer and the adhesive layer is increased by the carboxyl group.

When a small amount of KOH is added to a polyamic acid and then is heated at temperatures from 300 to 400° C., the surface of the thermoplastic polyimide layer 140 is modified with a carboxyl group as in chemical equation 1. To put it another way, while a polyamic acid is heated at temperatures from 300 to 400° C., imidization occurs. As a result, polyimide is produced from the polyamic acid by means of imidization.

[Chemical equation 1]

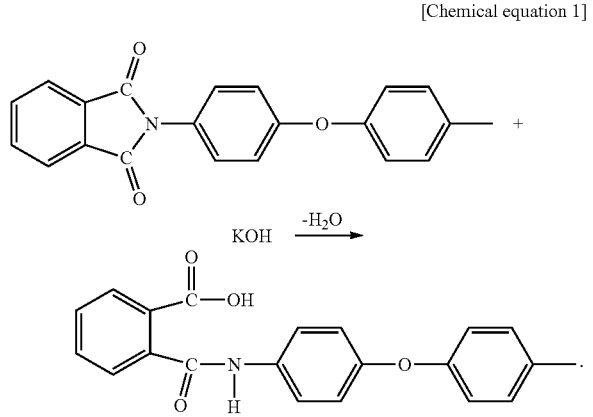

In this case, 0.5 to 3 parts by weight of KOH is preferably added with respect to 100 parts by weight of a polyamic acid. When less than 0.5 parts by weight of KOH is added with respect to 100 parts by weight of a polyamic acid, it may be difficult to modify the surface of the thermoplastic polyimide layer. Conversely, when more than 3 parts by weight of KOH is added with respect to 100 parts by weight of a polyamic acid, the imide structure of the polyamic acid or the polyimide is broken down. Thus, physical and chemical properties of the polyimide are undermined.

Attaching an Adhesive Layer onto the Thermoplastic Polyimide Layer

In step 130, an adhesive layer is attached onto the thermoplastic polyimide layer.

A variety of adhesives such as an acrylic adhesive, a rubber adhesive, a silicone adhesive, polyvinyl ether, and the like may be used as an adhesive layer. Considering the adhesive property of an adhesive applied to a semiconductor chip and the extent to which the adhesive is washed after being separated from the semiconductor chip, an (metha) acrylic adhesive, in which an (metha) acrylic polymer is used as a base polymer, is preferable.

In relation to a polyimide film for a semiconductor package reflow process manufactured according to the above-described steps (S110 to S130), a polyamic acid is used for the thermoplastic polyimide layer, and the polyamic acid is prepared by means of a synthesis of an aromatic diamine containing any one of an ether group, a ketone group and a methyl group and an aromatic dianhydride containing any one of an ether group, a ketone group and a methyl group in an organic solvent. Thus, the thermoplastic polyimide layer may have glass transition temperature of 260° C. or lower.

That is, the thermoplastic polyimide layer having glass transition temperature of 260° C. or lower is applied to the polyimide film for a semiconductor package reflow process manufactured according to the steps of the embodiment of the present invention such that the releasing property of the polyimide film is ensured after reflow, thereby enabling the polyimide film to be easily attached to and detached from a semiconductor chip.

Further, a thermoplastic polyimide layer the surface of which is modified with a carboxyl group is applied to the polyimide film for a semiconductor package reflow process manufactured according to the steps of the embodiment of the present invention such that the adhesive force between the thermoplastic polyimide layer and the adhesive layer is significantly increased by the carboxyl group.

Embodiment

Preferred embodiments of the present invention are described below so that the present invention can be better understood. However, it will be apparent to one having ordinary skill in the art to which the present invention pertains that the embodiments are provided only as examples and may be modified and changed in many different forms within the scope and technical spirit of the present invention. Thus, it should be understood that such modifications and changes are included in the appended claims.

1. Manufacturing a Polyimide Film

Embodiment 1

First, 36.6 g of 3,3'-dimethyl-[1,1'-biphenyl]-4,4'-diamine and 53.4 g of 3,3',4,4'-benzophenonetetracarboxylic dianhydride were polymerized in 410 g of NMP so as to synthesize a polyamic acid.

Next, 6 μm of a polyamic acid composition where 2 parts by weight of KOH was added with respect to 100 parts by weight of a polyamic acid was applied onto a thermosetting polyimide film and then was heated at 350° C. such that a thermoplastic polyimide layer the surface of which was modified with a carboxyl group was formed.

Next, an acrylic adhesive layer was attached onto the thermoplastic polyimide layer such that a polyimide film was manufactured.

Embodiment 2

First, 1.5 parts by weight of KOH was added with respect to 100 parts by weight of a polyamic acid and then heated at 340° C. Except for this, a polyimide film was manufactured according to the same method as that in embodiment 1.

Embodiment 3

First, 3 parts by weight of KOH was added with respect to 100 parts by weight of a polyamic acid and then heated at 360° C. Except for this, a polyimide film was manufactured according to the same method as that in embodiment 1.

Comparative Example 1

First, 36.6 g of 3,3'-dimethyl-[1,1'-biphenyl]-4,4'-diamine and 53.4 g of 3,3',4,4'-benzophenonetetracarboxylic dianhydride were polymerized in 410 g of NMP so as to synthesize a polyamic acid, and 6 μm of the polyamic acid was applied onto a thermosetting polyimide film and then heated at 350° C. such that a thermoplastic polyimide layer was formed.

Next, an acrylic adhesive layer was attached onto the thermoplastic polyimide layer such that a polyimide film was manufactured.

2. Evaluating Physical Properties

Table 1 shows evaluated physical properties of a polyimide film manufactured according to embodiments 1 to 3 and comparison 1.

1) Glass Transition Temperature

Glass transition temperature of a thermoplastic polyimide layer was measured with Q400 of TA Instruments.

2) Adhesive Force

A polyimide film is cut to have a width of 100 mm and a length of 100 mm and press-heated at 260° C. and 500 kgf, and the adhesive force between a thermoplastic polyimide layer and an adhesive layer was measured according to the method of IPC 650.

TABLE 1

|  | Glass transition temperature (° C.) | Adhesive force (kgf/cm) |
|---|---|---|
| Embodiment 1 | 196 | 1.3 |
| Embodiment 2 | 198 | 1.4 |
| Embodiment 3 | 203 | 1.5 |
| Comparative example | 274 | 0.8 |

With reference to table 1, glass transition temperatures of a thermoplastic polyimide layer in a polyimide film manufactured according to embodiments 1 to 3 ranged from 196 to 203° C. Thus, the glass transition temperatures were below 260° C., a target temperature. Additionally, an adhesive force between a thermoplastic polyimide layer and an adhesive layer in a polyimide film manufactured according to embodiments 1 to 3 ranged from 1.3 to 1.5 kgf/cm. Thus, an excellent adhesive force was successfully ensured.

On the other hand, glass transition temperature of a thermoplastic polyimide layer in a polyimide film manufactured according to comparative example 1 was 274° C. which exceeded a target temperature. As a result, an adhesive force between a thermoplastic polyimide layer and an adhesive layer was only 0.8 kgf/cm.

The present invention has been described with reference to the embodiments. However, the present invention may be modified and changed in many different forms by one having ordinary skill in the art to which the present invention pertains. Such modifications and changes may be included in the present invention as long as they do not depart from the technical spirit of the present invention. Therefore, the scope of the right to the present invention should be defined according to the appended claims.

The invention claimed is:

1. A polyimide film for a semiconductor package reflow process, wherein the polyimide film consists of:
   a non-thermoplastic polyimide layer;
   a thermoplastic polyimide layer piled onto the non-thermoplastic polyimide layer and having glass transition temperature lower than or equal to reflow temperature; and
   an adhesive layer attached onto the thermoplastic polyimide layer,
   wherein a surface of the thermoplastic polyimide layer is modified with a carboxyl group, and
   wherein the thermoplastic polyimide layer has glass transition temperature lower than or equal to 260° C.

2. The polyimide film for a semiconductor package reflow process according to claim 1, wherein a polyamic acid is used for the formation of the thermoplastic polyimide layer, and the polyamic acid is prepared by a synthesis of an aromatic diamine comprising any one of an ether group, a ketone group and a methyl group and an aromatic dianhydride comprising any one of an ether group, a ketone group and a methyl group in an organic solvent.

3. The polyimide film for a semiconductor package reflow process according to claim 2, wherein the aromatic diamine comprises 3,3'-dimethyl-[1,1'-biphenyl]-4,4'-diamine, the aromatic dianhydride comprises 3,3', 4,4' benzophenonetetracarboxylic dianhydride.

4. The polyimide film for a semiconductor package reflow process according to claim 2, wherein a surface of the thermoplastic polyimide layer is modified with a carboxyl group by means of addition of potassium hydroxide (KOH) to the polyamic acid and heating the same at temperatures from 300 to 400° C.

5. A manufacturing method for the polyimide film of claim 1, comprising:
   step (a) of preparing the non-thermoplastic polyimide layer
   step (b) of attaching, onto the non-thermoplastic polyimide layer, the thermoplastic polyimide layer; and
   step (c) of attaching an adhesive layer onto the thermoplastic polyimide layer.

6. The manufacturing method for a polyimide film for a semiconductor package reflow process according to claim 5, wherein a polyamic acid is used for the formation of the thermoplastic polyimide layer, wherein the polyamic acid is prepared by a synthesis of an aromatic diamine comprising any one of an ether group, a ketone group and a methyl group and aromatic dianhydride comprising any one of an ether group, a ketone group and a methyl group in an organic solvent.

7. The manufacturing method for a polyimide film for a semiconductor package reflow process according to claim 6, wherein the aromatic diamine comprises 3,3'-dimethyl-[1,1'-biphenyl]-4,4'-diamine, and the aromatic dianhydride comprises 3,3', 4,4'-benzophenonetetracarboxylic dianhydride.

8. The manufacturing method for a polyimide film for a semiconductor package reflow process according to claim 6, wherein a surface of the thermoplastic polyimide layer is modified with a carboxyl group by means of addition of KOH to the polyamic acid and heating the same at temperatures from 300 to 400° C.

9. The manufacturing method for a polyimide film for a semiconductor package reflow process according to claim 8, wherein 0.5 to 3 parts by weight of KOH is added with respect to 100 parts by weight of the polyamic acid.

* * * * *